(12) United States Patent
Tanibuchi et al.

(10) Patent No.: US 7,789,598 B2
(45) Date of Patent: Sep. 7, 2010

(54) SURFACE COATED CUTTING TOOL

(75) Inventors: Takahito Tanibuchi, Satsumasendai (JP); Hirotoshi Itoh, Satsumasendai (JP)

(73) Assignee: Kyocera Corporation, Kyoto (JP)

( * ) Notice: Subject to any disclaimer, the term of this patent is extended or adjusted under 35 U.S.C. 154(b) by 1092 days.

(21) Appl. No.: 11/485,644

(22) Filed: Jul. 11, 2006

(65) Prior Publication Data
US 2007/0166545 A1   Jul. 19, 2007

(30) Foreign Application Priority Data

Jul. 12, 2005 (JP) ............................. 2005-202702
Nov. 28, 2005 (JP) ............................. 2005-342879

(51) Int. Cl.
*B26B 1/00* (2006.01)
*B32B 3/00* (2006.01)

(52) U.S. Cl. ...................................... 407/119; 428/323

(58) Field of Classification Search ................ 407/119; 51/307; 428/323, 357, 411.1, 372
See application file for complete search history.

(56) References Cited

U.S. PATENT DOCUMENTS

| 5,643,523 | A | * | 7/1997 | Simpson | .................. 264/400 |
|---|---|---|---|---|---|
| 5,770,261 | A | * | 6/1998 | Nakamura et al. | ..... 427/255.19 |
| 6,082,936 | A | * | 7/2000 | Moriguchi et al. | .......... 407/119 |
| 7,153,562 | B2 | * | 12/2006 | Rodmar et al. | ............... 428/216 |
| 7,662,020 | B2 | * | 2/2010 | Okada et al. | .................... 451/2 |
| 2006/0177584 | A1 | * | 8/2006 | Gates et al. | ............. 427/255.34 |
| 2007/0292670 | A1 | * | 12/2007 | Okada et al. | ................. 428/216 |
| 2007/0298230 | A1 | * | 12/2007 | Omori et al. | ................. 428/212 |
| 2008/0260477 | A1 | * | 10/2008 | Omori et al. | ................. 407/119 |

FOREIGN PATENT DOCUMENTS

| JP | 08-011005 | 1/1996 |
|---|---|---|
| JP | 2004-050385 | 2/2004 |

\* cited by examiner

*Primary Examiner*—Will Fridie, Jr.
(74) *Attorney, Agent, or Firm*—Hogan Lovells US LLP

(57) ABSTRACT

A surface coated cutting tool comprises a substrate and a hard layer formed on the surface of the substrate, and a contact angle of water θ on the rake face of the hard layer is in the range of 30 to 80°. A surface coated cutting tool comprises a substrate and a hard layer formed on the surface of the substrate, and a contact angle of water $\theta_R$ on the rake face of the hard layer and a contact angle of water $\theta_F$ on the flank face of the hard layer have a relation of $\theta_R < \theta_F$. Thereby, excellent resistance to wear and fracture can be shown, leading to a excellent surface coated cutting tool.

7 Claims, 4 Drawing Sheets

(a)

(b)

SURFACE COATED CUTTING TOOL

Priority is claimed to Japanese Patent Application No. 2005-202702 filed on Jul. 12, 2005, No. 2005-342879 filed on Nov. 28, 2005, the disclosure of which is incorporated by reference in its entirety.

BACKGROUND OF THE INVENTION

1. Field of the Invention

The present invention relates to a surface coated cutting tool comprising a hard layer formed on the surface and having cutting characteristics such as resistance to fracture and wear.

2. Description of Related Art

Conventionally, a surface coated cutting tool having a hard layer formed on the surface of a substrate has been widely used. In many cases, a tool wherein a hard layer composed of a single layer or a multilayer of layers such as TiC layer, TiN layer, TiCN layer, $Al_2O_3$ layer and TiAlN layer is formed on the surface of a hard substrate such as cemented carbide, cermet and ceramics has been used as the cutting tool.

Cutting processes are carried out with such a cutting-tool largely in wet cutting, where operations are carried out throwing a cutting fluid mainly composed of water on a cut part in order to reduce temperature rise of a cutting edge during cutting processes.

Recently, as cutting processes become more highly efficient, high speed cutting processes are increasingly carried out. Even in wet cutting, a cut part such as a rake face and a cutting edge sometimes reaches very high temperature. Consequently, a conventional tool is tend to cause lowering wear resistance, film peeling, notch wear, poor accuracy in operations due to plastic deformation of a cutting edge and increased cutting resistance. These cause sudden tool damage such as fracture of a cutting edge and occurrence of abnormal wear, making it difficult for a cutting tool to have a longer life.

In particular, there have been such problems as the high-temperature state of a rake face and a cutting edge, progress of crater wear due to deterioration of a hard layer and film peeling.

On the other hand, a flank face does not come into as high-temperature state as a rake face and a cutting edge. However, in other cases than wet high-speed cutting processes, a cutting edge linked to a flank face reaches high temperature as well and therefore a work material is tend to adhere to a flank face. When a work material adheres to a flank face of a tool, there are problems such as poor operation accuracy and deteriorated surface roughness of a work material. In addition, when the adhering material is removed, damage to a cutting edge such as peeling of a hard layer and chipping is tend to occur. In particular, at the time of high-speed cutting processes for finished surface, adhesion of a work material to a flank face has been a large problem.

It is well known that in the above cutting tool, characteristics of a cutting edge have large influence on cutting characteristics. For example, Japanese Unexamined Patent Publication No. H8-11005 discloses that in a cutting edge of a surface coated cutting tool wherein a multilayer film including an oxide layer is formed, removal of part of a multilayer film including an oxide layer improves resistance to peeling and fracture of a hard layer.

Furthermore, Japanese Unexamined Patent Publication No. 2004-50385 discloses that by polishing the surface of a surface coated cutting tool having a hard layer formed and obtaining a polished surface smooth enough to gloss the whole tool, friction coefficient of a cutting edge and a work material during cutting is made small and heat generation in a cutting edge and adhesion of a work material are prevented.

However, a smoothed surface obtained by processing the surface including a cutting edge of a hard layer as mentioned in these publications reduces cutting resistance and improves tribology property, but does not sufficiently spread a cutting fluid throughout the surface of a tool. In particular, a cutting fluid cannot sufficiently spread through a rake face which reaches very high temperature during cutting.

This makes it impossible to sufficiently attain cooling effect by a cutting fluid and makes it difficult to quickly release the heat generated by cutting. There has been also the problem that even in wet cutting where heat is relatively hardly generated, in case of high-speed cutting processes, suddenly decreased wear resistance shortens a tool life.

Moreover, on a flank face which has large influence on accuracy of the finished surface of a work material, a smoothed surface obtained by processing the surface including a cutting edge of a hard layer is not enough alone. Namely, cutting resistance is reduced and tribology property is improved, but in case of high speed cutting, adhesion of a work material to a flank face cannot be inhibited, resulting in separation of an adhering work material, film peeling accompanying this and tool damage such as chipping of a cutting edge.

SUMMARY OF THE INVENTION

The present invention provides a excellent surface coated cutting tool which can suppress influence of heat generating in wet high speed cutting processes on a cutting edge and show excellent resistance to wear and fracture even in high speed cutting.

The present invention also provides a surface coated cutting tool which can suppress adhesion of a work material to a flank face easily caused by high speed cutting processes and have longer life and highly accurate finished surface.

The present inventors have found a new fact that improved wettability to a cutting fluid on the rake face of a surface coated cutting tool makes it possible to spread a cutting fluid throughout the surface of a cutting tool, thereby sufficiently showing the cooling effect of a cutting fluid and reducing temperature rise of a cutting edge caused by cutting. As a result, it is possible to obtain a excellent surface coated cutting tool which can prevent a hard layer from deteriorating due to temperature rise of a cutting edge by cutting and show excellent resistance to wear and fracture even in high speed cutting processes.

That is, the cutting tool of the present invention comprises a substrate having a structure where a cutting edge is formed on the cross-ridge portion of a rake face and a flank face and a hard layer formed on the surface of the substrate, and a contact angle of water $\theta$ on the rake face of the hard layer is in the range of 30 to 80°.

This makes it easy to spread, throughout the surface of the hard layer, a cutting fluid used in so-called wet cutting where a cutting fluid is used for cutting. Therefore, the heat generated by cutting can spread more smoothly throughout the surface of a tool to prevent the temperature rise of a cutting edge and prevent lowering of wear resistance due to a highly heated cutting edge, plastic deformation of a cutting edge and adhesion of a work material to a cutting edge. As a result, even in high speed cutting processes where a cutting edge is especially more subjected to high temperature, it is possible to obtain a excellent cutting tool which can show excellent resistance to wear and fracture without lowering wear resistance and plastic deformation of a cutting edge.

When a contact angle of water $\theta_R$ on the rake face of a hard layer and a contact angle of water $\theta_F$ on the flank face of the hard layer have a relation of $\theta_R<\theta_F$, excellent wettability on the rake face and excellent resistance to adhesion on the flank face are shown. Thus, since a cutting fluid sufficiently spreads on the rake face and the cooling effect of a cutting fluid is adequately shown, temperature rise by cutting is reduced on the rake face. Consequently, deterioration of a hard layer can be suppressed and progress of crater wear and tool damage such as film peeling can be prevented, thereby making it possible to show excellent resistance to wear and fracture even in high speed cutting processes. Moreover, on the flank face, lowering wettability to water suppresses adhesion of a work material, making it difficult to cause tool damage such as film peeling and chipping of a cutting edge. Furthermore, stable surface roughness of a finished surface can be attained even in high speed cutting and a excellent cutting tool can be provided.

That is, the other cutting tool of the present invention comprises a substrate having a structure where a cutting edge is formed on the cross-ridge portion of a rake face and a flank face and a hard layer formed on the surface of the substrate, and a contact angle of water $\theta_R$ on the rake face of the hard layer and a contact angle of water $\theta_F$ on the flank face of the hard layer have a relation of $\theta_R<\theta_F$.

This can achieve both excellent wettability on the rake face and excellent resistance to adhesion on the flank face at the same time. Thus, on the rake face, the cooling effect of a cutting fluid is excellent because the cutting fluid sufficiently spreads, and on the flank face, adhesion of a work material is suppressed. Consequently, tool damage such as film peeling and chipping of a cutting edge is inhibited, thereby obtaining a excellent surface coated cutting tool which has excellent resistance to wear and fracture even in wet high speed cutting processes and shows good accuracy in cutting processes.

The method of processing a work material in the present invention comprises the steps of putting a cutting edge of the surface coated cutting tool on the surface of a work material, rotating either the cutting edge or the work material and separating the cutting edge from the surface of the work material.

Thereby, it becomes possible to obtain a work piece having stable and good finished surfaces.

DETAILED DESCRIPTION OF PREFERRED EMBODIMENTS

<Surface Coated Cutting Tool>

The embodiments of the surface coated cutting tool of the present invention will be described in detail below with reference to the drawings.

First Embodiment

Figure 1:
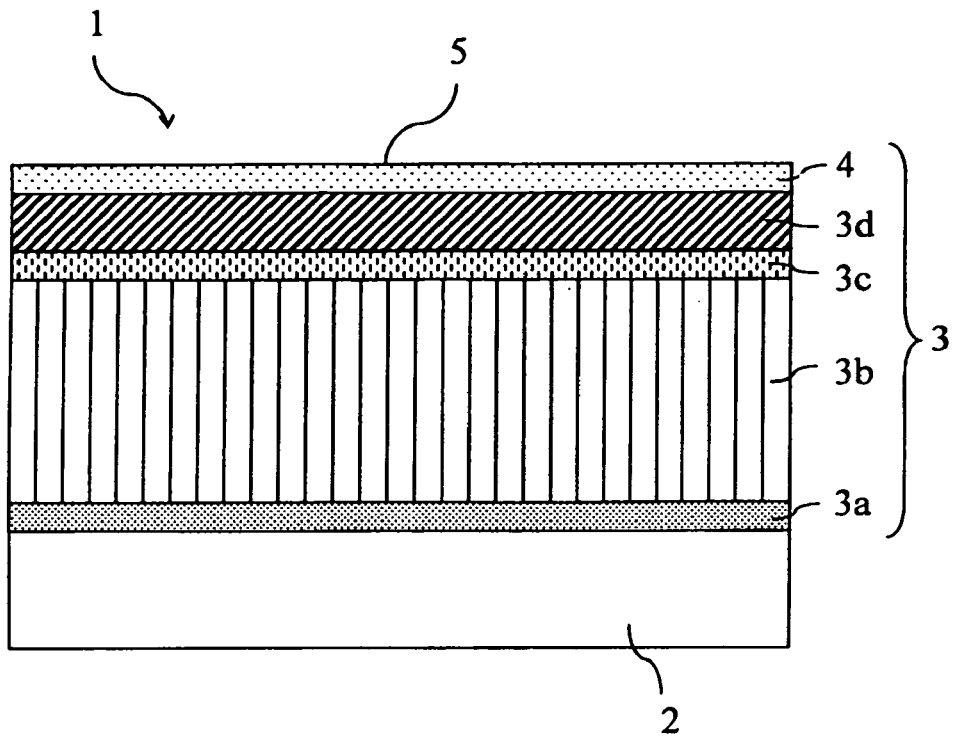
FIG. 1 is a schematic cross-sectional view of enlarged main part, showing layer structure of a hard layer according to the first embodiment of the present invention.
Figure 2:
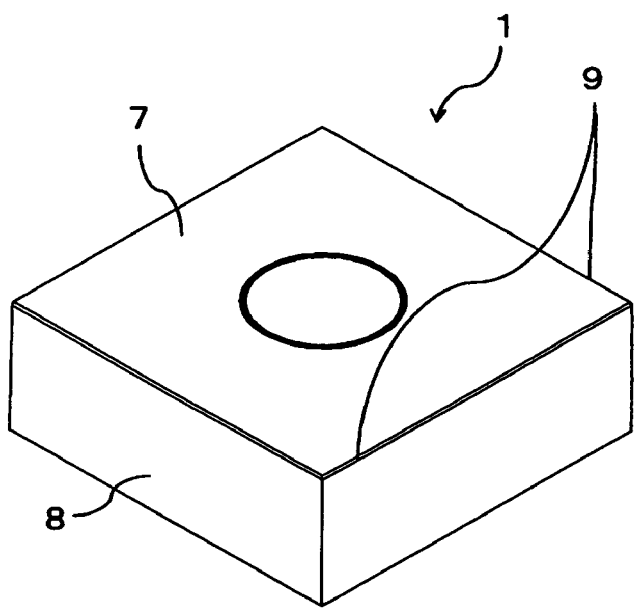
FIG. 2 is a schematic perspective view showing a surface coated cutting tool according to the embodiment of the present invention.
Figure 3:
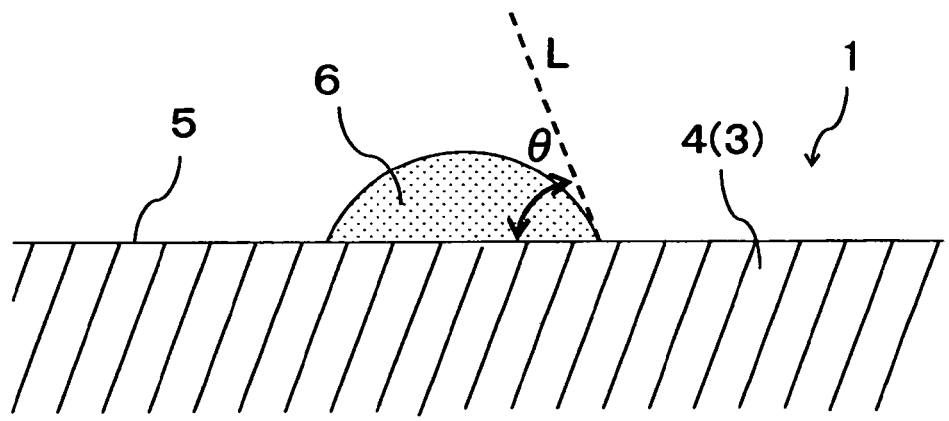
FIG. 3 is a pattern diagram to describe a method of measuring a contact angle of water θ on the rake face.

FIG. 1 is a schematic cross-sectional view of enlarged main part, showing layer structure of a hard layer according to the first embodiment. FIG. 2 is a schematic perspective view showing a surface coated cutting tool according to this embodiment. FIG. 3 is a pattern diagram to describe a method of measuring a contact angle of water θ on the rake face.

The surface coated cutting tool of this embodiment is a throw-away tip type cutting tool (hereinafter, referred to simply as tool in some cases). As shown in FIGS. 1 and 2, a tool 1 comprises an approximately flat-plate-like substrate 2 and a hard layer 3 formed on the surface of the substrate 2. Furthermore, as shown in FIG. 2, the tool 1 has a structure where a rake face 7 is provided on the principal surface of the substrate 2, a flank face 8 is provided on the side surface and a cutting edge 9 is provided on the cross-ridge portion of the rake face 7 and the flank face 8.

As the substrate 2, for example, cemented carbide and cermet wherein a hard phase composed of tungsten carbide (WC), titanium carbide (TiC) or titanium carbonitride (TiCN) and, if desired, at least one selected from the group consisting of carbide, nitride and carbonitride of metals of the groups 4, 5 and 6 of the periodic table is bound with a binder phase composed of an iron group metal such as cobalt (Co) and/or nickel (Ni), hard materials such as a silicon nitride ($Si_3N_4$) or aluminum oxide ($Al_2O_3$) ceramic sintered body and a superhard sintered body mainly composed of cubic boron nitride (cBN) and diamond, or very hard materials of such metals as carbon steel, high-speed steel and alloy steel may be used.

Examples of the metals of the groups 4, 5 and 6 of the periodic table include Ti, Zr, Hf, V, Nb, Ta, Cr, Mo and W.

In particular, the substrate 2 preferably consists of cemented carbide constituted by a hard phase mainly composed of tungsten carbide (WC) and a binder phase composed of cobalt (Co). The substrate 2 consisting of cemented carbide can achieve a good balance between hardness and toughness and makes it possible to carry out stable cutting processes for high-speed wet cutting processes.

The hard layer 3 is preferably composed of a single layer or a multilayer of layers of a compound of at least one or more elements selected from the metal elements of the groups 4, 5 and 6 of the periodic table, Al and Si, and at least one or more elements selected from the group of oxygen, nitrogen, carbon and boron. This can improve the wear resistance and fracture resistance of the tool 1.

As shown in FIG. 1, the hard layer 3 of this embodiment is composed of a multilayer of layers. In FIG. 1, the first layer 3a is a titanium nitride layer; the second layer 3b is a titanium carbonitride layer; the third layer 3c is a titanium oxycarbonitride (TiCNO) layer; the fourth layer 3d is an aluminum oxide layer; and the surface layer 4 as the fifth layer is a titanium nitride layer.

In this embodiment, a contact angle of water θ to the surface 5 on the rake face 7 of the hard layer 3 is in the range of 30 to 80°. This optimizes the wettability of the surface 5 of the hard layer 3 to a cutting fluid and easily spreads a cutting fluid throughout the surface of the tool 1. And it is possible to efficiently release the heat generated by cutting and suppress deterioration of the hard layer 3 by preventing temperature rise due to cutting. Therefore, the hard layer 3 can demonstrate long tool life without being deteriorated even in high speed cutting where a cutting edge is tend to reach high temperature. The desirable range of the contact angle of water θ is 40 to 60° in that the way in which a cutting fluid spreads can be optimized so as to make the most of cutting performance of the tool 1.

On the other hand, when the contact angle of water θ is larger than 80°, it becomes difficult to spread a cutting fluid throughout the surface of the tool 1. This makes it impossible to sufficiently release the heat generated by cutting with a cutting fluid, deteriorates the hard layer 3 due to temperature rise of a cutting edge of the tool 1 and causes lowering of wear resistance, film peeling and tool damage such as chipping. When the contact angle of water θ is smaller than 30°, a cutting fluid too easily spreads through the surface, and permeates the inside of the hard layer 3 because of cooling crack inside the hard layer 3 of the tool 1. Consequently, a cutting edge reaches high temperature at the time of cutting and the cutting fluid coming into the crack of the hard layer 3 makes it easy to deteriorate the hard layer 3 and lowers wear resistance.

Examples of a method of measuring the contact angle of water θ include meniscograph method, capillary tube method and sessile drop method. However, in the present invention, as long as measurement is possible, sessile drop method is used. When measurement through sessile drop method is difficult, other methods are used. Concretely, first, as shown in FIG. 3, a droplet 6 composed of distilled water is put on the surface 5 of the hard layer 3 (the surface layer 4) which is an object to be measured. Next, sessile drop method to measure an angle θ made by a tangent line L of the droplet 6 in the marginal part of the area where the droplet 6 is in contact with the object to be measured and the surface 5 of the object to be measured is used based on JIS R3257. This enables the contact angle of water θ to be easily and accurately measured.

The contact angle of water θ can be controlled by comprehensively optimizing energy by the surface and grain boundary of the hard layer 3. Namely, surface energy and grain boundary energy which constitute interfacial energy are changed by overall characteristics such as manufacturing conditions including heat history at the time of deposition, flow rate of reactants and deposition time in addition to properties such as film material of the surface layer 4 of the hard layer 3, particle size and surface roughness. Therefore, it is necessary to comprehensively take into account such conditions as properties and manufacturing methods.

To be more specific, it seems important for the contact angle of water θ on the surface 5 of the hard layer 3 to control hydrophilicity on the surface 5 of the hard layer 3 by controlling interfacial energy on the surface 5 of the hard layer 3. The interfacial energy changes in accordance with the deposition history and polished conditions of the hard layer 3. Therefore, by comprehensively optimizing these conditions, the present invention enables the contact angle of water θ on the surface 5 of the hard layer 3 to be controlled in a predetermined range.

For instance, increased interfacial energy on the surface 5 of the hard layer 3 enables the contact angle of water θ to be made small. One example of methods to increase interfacial energy on the surface 5 is to process the surface 5 of the hard layer 3. This makes it possible to introduce defect to the surface 5 of the hard layer 3 and attain higher energy. Moreover, atomization of particles constituting the hard layer 3 enables one of interfacial energy, i.e. energy at the grain boundary (grain boundary energy) to be higher.

In this embodiment, a mean particle size of the surface layer 4 on the rake face 7 of the hard layer 3 may be 0.01 to 2 μm, preferably, 0.01 to 1 μm. This can optimize grain boundary energy on the surface 5 of the hard layer 3 of the tool 1, increase wettability between the surface 5 of the hard layer 3 and a cutting fluid mainly composed of water and prevent temperature rise of a cutting edge by cutting.

The mean particle size of the surface layer 4 on the rake face 7 of the hard layer 3 stands for a value measured as follows. That is, first, as for the surface or cross-sectional surface of the surface layer 4 on the rake face 7, the structure is observed with the use of a scanning electron microscope or a transmission electron microscope. At this time, the areas of each particle constituting the surface layer 4 and observed in the field of view of not less than 100 nm×100 nm and not less than five particles are calculated through image analysis method. Then, after estimating their average area, the average area is converted into a circle. The mean particle size stands for a diameter of the circle. Particularly, in order to optimize interfacial energy and the contact angle of water θ, it is desirable that the mean particle size of the surface layer 4 on the rake face 7 is 0.05 to 0.5 μm.

The surface layer 4 is preferably composed of a titanium nitride (TiN) layer, a zirconium nitride layer or an aluminum oxide ($Al_2O_3$) layer having α-type crystal structure and more preferably composed of a titanium nitride layer or a zirconium nitride layer. This can provide better heat conductivity than the one composed of a titanium carbide layer and a titanium carbonitride layer, improve heat release of the surface layer 4 itself in addition to heat release by a cutting fluid and prevent temperature rise of a cutting edge by cutting.

In particular, the surface layer 4 is preferably composed of a titanium nitride layer. Since titanium nitride has high surface energy, i.e. one of interfacial energy, it can easily increase the contact angle of water θ on the surface. Therefore, wettability to water, namely, wettability to a cutting fluid mainly composed of water is excellent and temperature rise of a cutting edge by cutting can be prevented.

It is preferable that the hard layer 3 on the cutting edge 9 is polished in order to reduce residual stress occurring at the time of coating the hard layer 3 and suppress occurrence of chipping. In particular, when the surface layer 4 is composed of a titanium nitride layer or a zirconium nitride layer, it is desirable that the hard layer 3 on the cutting edge 9 is polished so that the surface layer 4 can remain on the cutting edge 9. Since this never allows layers made of different material to be exposed in the vicinity of the cutting edge 9, a cutting fluid can more smoothly run on the cutting edge 9 and cutting resistance can be reduced, leading to improved wear resistance.

Preferably, the surface roughness in maximum height Rz arithmetical 5 on the rake face 7 of the hard layer 3 is in the range of 0.3 to 1.5 μm. This can control characteristics variation throughout the surface of the hard layer 3 and easily adjust the contact angle of water θ within the above range. Furthermore, preferably, the arithmetic arithmetical mean surface roughness Ra of the surface 5 on the rake face 7 of the hard layer 3 is in the range of 0.05 to 0.3 μm in the range of the maximum height Rz. This can optimize surface energy and the contact angle of water θ, easily spread a cutting fluid throughout the surface of the tool 1 and efficiently lower the temperature raised by cutting.

As a method of measuring the arithmetic arithmetical mean surface roughness Ra and the maximum height Rz, a stylus-type surface roughness measuring instrument may be used based on JIS B0601'01. If such measurement is difficult, with the use of such a measuring instrument as a laser microscope and an atomic force microscope, measurements can be made by scanning and estimating irregular shapes on the surface 5 of the hard layer 3. If a stylus-type surface roughness measuring instrument is used in measuring the surface roughness (Rz, Ra), measurements are made with a cutoff value of 0.25 mm, a reference length of 0.8 mm and a scanning speed of 0.1 mm/second.

Next, the method of manufacturing a cutting tool according to the above-mentioned first embodiment will be described.

First, metal powder, carbon powder and the like are properly added to and mixed with inorganic powder such as metal carbide, nitride, carbonitride and oxide that can form the aforementioned hard alloy by sintering. The mixture is molded into a predetermined tool shape through a well-known method such as press molding, slip casting, extrusion molding and cold isostatic pressing, and then sintered in vacuum or in non-oxidation atmosphere, thereby preparing the substrate 2 composed of the aforementioned hard material.

Next, the hard layer 3 is formed on the surface of the substrate 2, for example, through chemical vapor deposition (CVD) method. For example, when the surface layer 4 of the hard layer 3 is formed, by controlling a ratio of a reacting furnace volume Vr and a flow rate Vg of gas supplied per minute at room temperature and atmosphere pressure within a predetermined range, particle size of particles in the surface layer 4, a percentage of defect and residual stress are changed, making it possible to control film material of the surface layer 4 to keep interfacial energy high. This provides film material excellent in wettability of the surface 5 to water.

As a specific example to form a titanium nitride (TiN) layer as the surface layer 4, a mixed gas composed of 0.1 to 10% by volume, especially 1.5 to 10% by volume of titanium chloride ($TiCl_4$) gas, 1 to 60% by volume of nitrogen ($N_2$) gas and hydrogen ($H_2$) gas for the rest as reactive gas composition is adjusted. The inside of a reactor is set at a temperature of 800 to 1100° C. and a pressure of 5 to 85 kPa, and a flow rate Vg of the mixed gas is adjusted so that Vg/Vr can be in the range of 0.4 to 0.9, especially, 0.5 to 0.9.

In order to form a zirconium nitride layer as the surface layer 4, a mixed gas composed of 0.1 to 8% by volume of zirconium chloride ($ZrCl_4$) gas, 1 to 60% by volume of nitrogen ($N_2$) gas and hydrogen ($H_2$) gas for the rest as reactive gas composition is adjusted. The inside of a reactor is set at a temperature of 950 to 1100° C. and a pressure of 5 to 85 kPa, and a flow rate Vg of the mixed gas is adjusted so that Vg/Vr can be in the range of 0.4 to 0.9, especially, 0.5 to 0.9.

In order to form an aluminum oxide layer as the surface layer 4, a mixed gas composed of 3 to 20% by volume of aluminum chloride ($AlCl_3$) gas, 0.5 to 3.5% by volume of hydrogen chloride (HCl) gas, 0.01 to 5.0% by volume of carbon dioxide ($CO_2$) gas, 0 to 0.01% by volume of hydrogen sulfide ($H_2S$) gas and hydrogen ($H_2$) gas for the rest is used. Setting a temperature to 900 to 1100° C. and a pressure to 5 to 10 kPa, a flow rate Vg of the mixed gas is adjusted so that Vg/Vr can be 0.2 to 0.5.

As the surface layer 4, other hard films such as titanium carbide or titanium carbonitride can be also used. When a titanium-based hard film other than these titanium nitride layers is formed, a flow rate Vg of the mixed gas and a reacting furnace volume Vr as well as deposition conditions of titanium nitride layer are adjusted so that Vg/Vr can be in the range of 0.4 to 0.7, especially, 0.5 to 0.6. At this time, a deposition temperature depends on material, but it is desirable to control the deposition temperature as above.

In order to form a 1 μm thick titanium nitride layer as the surface layer 4, first, for example, using the above conditions, a film to be formed has a film thickness of 2 to 4 μm, namely 2 to 4 times as large as an intended film thickness. After coating a film in this way, it is desirable to polish the film so as to have the intended film thickness, through brushing with diamond abrasive grains #500 or smaller than #500. This makes it possible to change the temperature at the time of deposition of the surface and lower interfacial energy of the surface 5 of the hard layer 3. And it is possible to remove the area where wettability deteriorates, uniformly introduce much smaller defect and keep interfacial energy high. Consequently, the exposed part of the surface layer 4 having high interfacial energy enables wettability of water on the surface of the surface layer 4 to be controlled in an appropriate range.

In the brushing process, desirably, a projection of brush bristle is 1 to 7 cm, especially, 1 to 5 cm. Even in a tool having irregular shape such as a tip breaker, this makes it possible to thoroughly polish the entire surface of the surface layer 4 without leaving unpolished part in the corner of the irregular shape. Therefore, the surface of the tool 1 can be provided with uniform surface roughness and wettability of water on the surface 5 of the hard layer 3 can be made uniform.

In the above embodiment, a method of coating the hard coated layer 3 through chemical vapor deposition (CVD) method is described. However, the present invention is not limited to this and other deposition methods including physical vapor deposition (PVD) method may be used to form the hard coated layer 3. In this case as well, by controlling a flow rate of deposition gas and the like, it is possible to form a film so that film material for the surface layer 4 can attain excellent wettability. At the same time, by polishing the surface 5 of the hard coated layer 3 through the above processing method, it is possible to control wettability of the surface 5 of the hard coated layer 3.

Also, in the above embodiment, the case where the hard coated layer 3 is composed of five layers is described, but in the present invention, the hard coated layer 3 may be a single layer. In case of a single layer, the single layer is desirably a titanium nitride (TiN) layer, a zirconium nitride (ZrN) layer, an aluminum oxide ($Al_2O_3$) layer having α-type crystal structure or the like, in order to attain better heat conductivity, improve heat release of the surface layer 4 itself as well as heat release by a cutting fluid and prevent temperature rise of a cutting edge by cutting.

Second Embodiment

Figure 4:
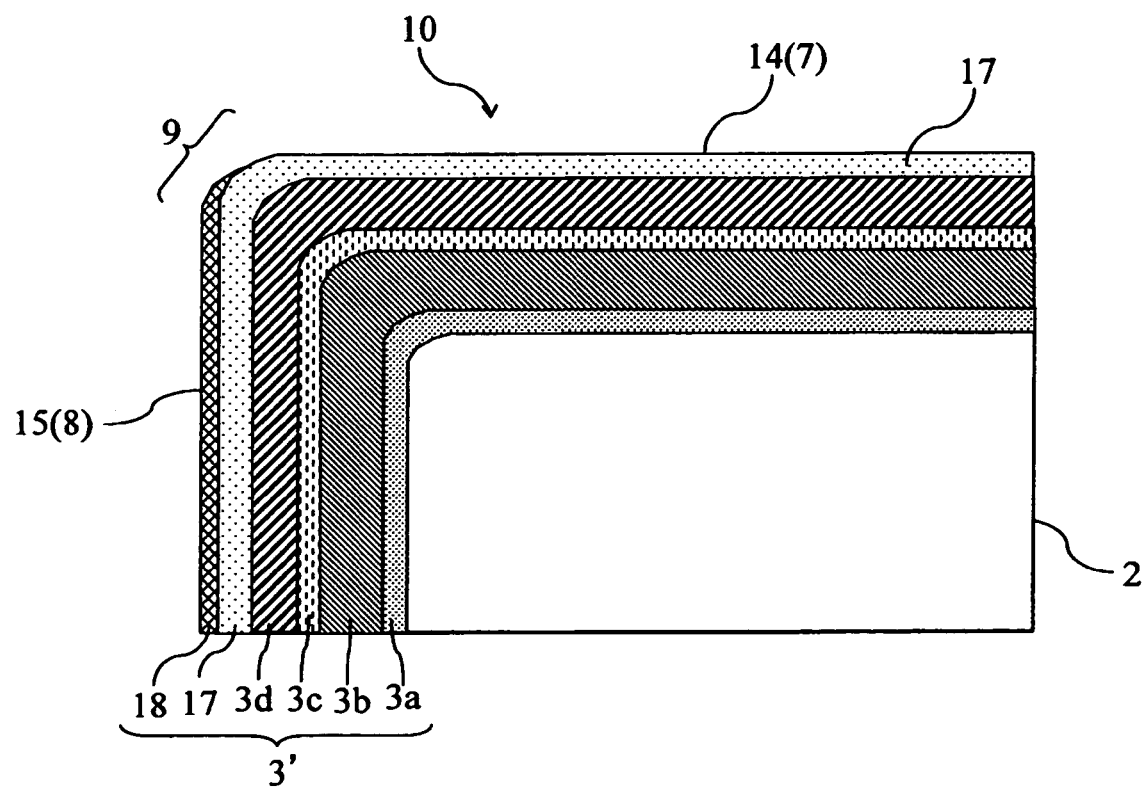
FIG. 4 is a schematic cross-sectional view of enlarged main part, showing layer structure of a hard layer according to the second embodiment of the present invention.
Figure 5:
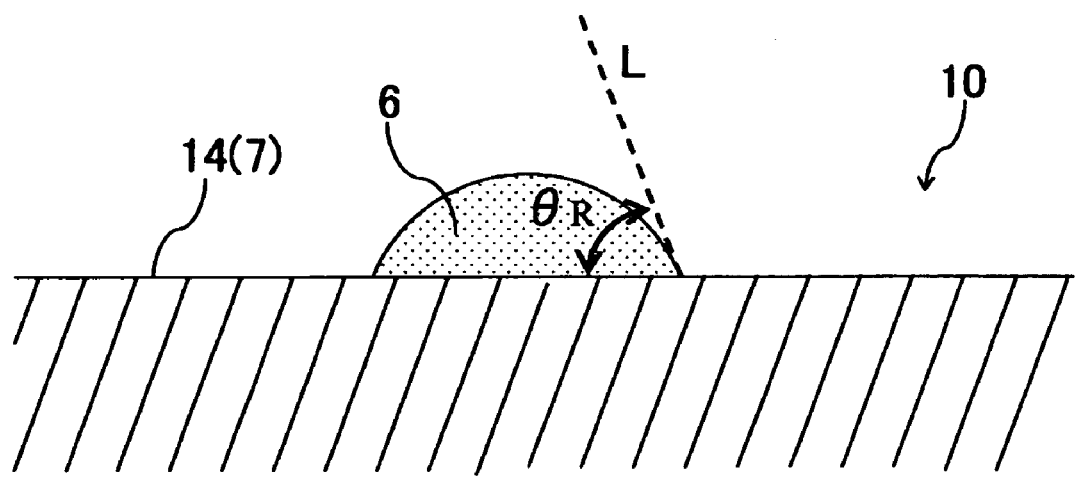
FIG. 5(a) is a pattern diagram to describe a method of measuring a contact angle of water $\theta_R$ on the rake face.
FIG. 5(b) is a pattern diagram to describe a method of measuring a contact angle of water $\theta_F$ on the flank face.
Figure 5:
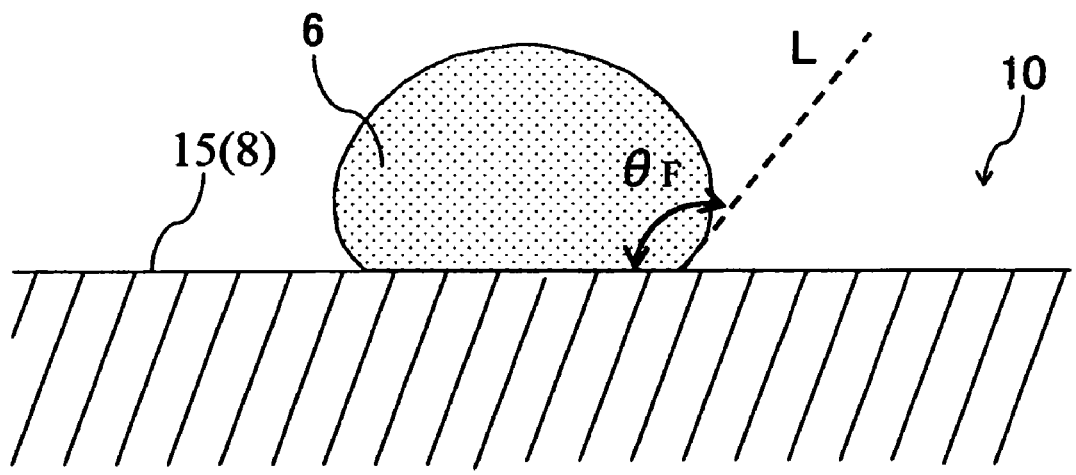
Figure 6:
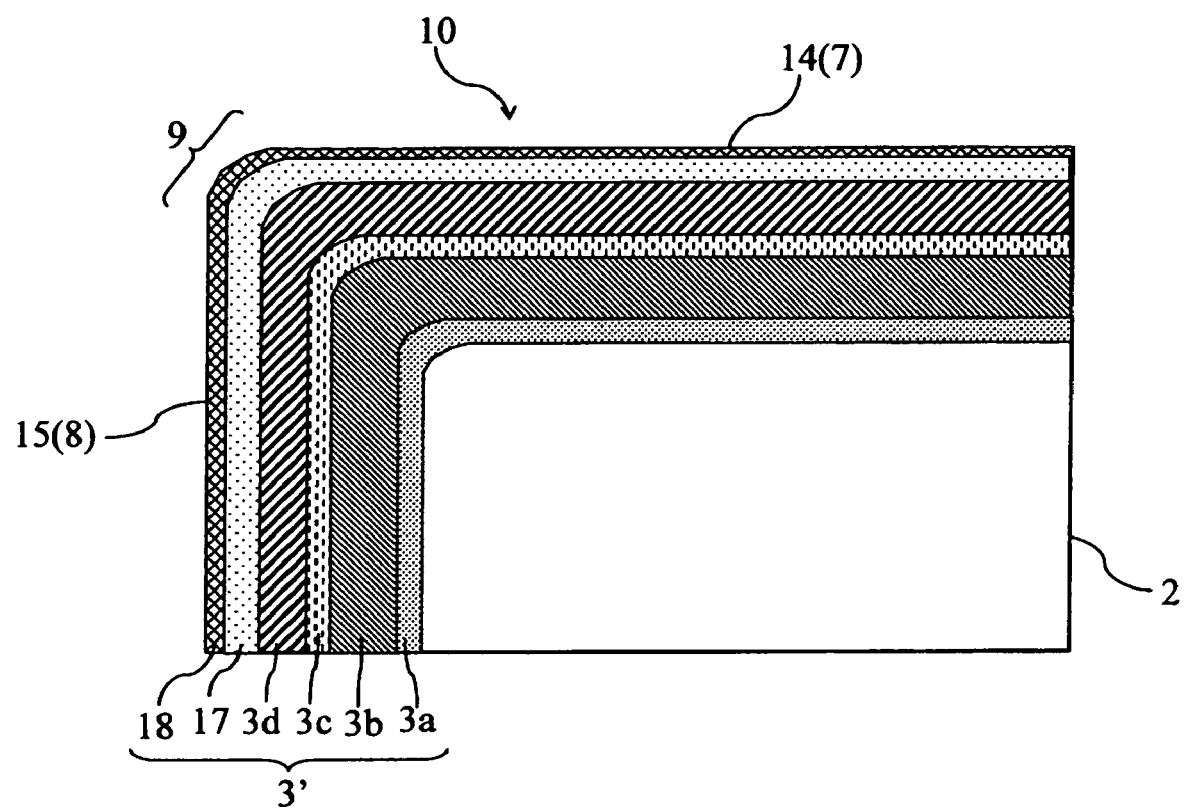
FIG. 6 is a schematic cross-sectional view of enlarged main part, showing layer structure of another hard layer according to the second embodiment of the present invention.

FIG. 4 is a schematic cross-sectional view of enlarged main part, showing layer structure of a hard coated layer according to the second embodiment. FIG. 5(*a*) is a pattern diagram to describe a method of measuring a contact angle of water $\theta_R$ on the rake face, and FIG. 5(*b*) is a pattern diagram to describe a method of measuring a contact angle of water $\theta_F$ on the flank face. FIG. 6 is a schematic cross-sectional view of enlarged main part, showing layer structure of another hard coated layer according to the second embodiment. In FIGS. 4 to 6, the same numerical references are given to the parts identical or equivalent to the above-mentioned structure of FIGS. 1 to 3 to omit description.

The cutting tool according to this embodiment is different from the above embodiment in that the contact angle of water of the hard coated layer has predetermined relationship on the rake face and the flank face. Specifically, as shown in FIG. 4, a hard coated layer 3' of this embodiment comprises a titanium nitride layer as the first layer 3a, a titanium carbonitride layer as the second layer 3b, a titanium oxycarbonitride (TiCNO) layer as the third layer 3c, an aluminum oxide layer as the fourth layer 3d, a titanium nitride layer as the fifth layer which is a lower layer 17 adjacent to an outer layer 18, and the outer layer 18 composed of a titanium nitride layer as the sixth layer.

A contact angle of water $\theta_R$ to the surface 14 on the rake face 7 of the hard coated layer 3' and a contact angle of water $\theta_F$ to the surface 15 on the flank face 8 of the hard coated layer 3' have a relation of $\theta_R < \theta_F$. This improves wettability to a cutting fluid on the rake face 7 and easily spreads a cutting fluid throughout the rake face 7, making it possible to efficiently release the heat generated by cutting. Therefore, temperature rise can be prevented especially on the rake face 7 which reaches high temperature during cutting and the hard coated layer 3' can be prevented from deteriorating. As a result, both in wet cutting and in high speed cutting processes where the cutting edge 9 and the rake face 7 are tend to reach high temperature, it is possible to improve wear resistance of the rake face 7 and show excellent tool life. Moreover, even if the cutting edge 9 of the tool 10 reaches high temperature due to the heat generated by cutting and a work material is softened, part of it hardly attaches to the flank face 8, because of the relation of $\theta_R < \theta_F$, i.e. lowered wettability to water on the flank face 8. Thus, the flank face 8 has better adhesion resistance than the rake face 7, thereby suppressing adhesion of a work material on the flank face 8, film peeling caused by removal of adhering material and fracture of the cutting edge 9 accompanying it. Consequently, even at the time of wet high-speed operations for finished surface, it is possible to prevent surface roughness on the finished surface of a work material from increasing due to adhesion of a work material to the flank face 8 and obtain a finished surface of good and stable quality.

Furthermore, the ratio $\theta_R/\theta_F$ of the contact angles of water $\theta_R$ and $\theta_F$ may be not less than 0.5, preferably not less than 0.8 and more preferably 0.85 to 0.90. Thereby, cooling effect on the rake face 7 and adhesion resistance on the flank face 8 can be achieved in a balanced manner. In particular, when the ratio $\theta_R/\theta_F$ is 0.85 to 0.90, wettability on the rake face 7 and adhesion resistance on the flank face 8 can be more effectively shown and a tool is prevented from being damaged due to wear on the rake face and adhesion on the flank face, resulting in a excellent tool.

As the contact angle of water $\theta$ in the above-mentioned first embodiment, the contact angle of water $\theta_R$ is preferably in the range of 30 to 80°. This optimizes wettability to a cutting fluid on the rake face 7 and easily spreads the cutting fluid throughout the surface. Therefore, it is possible to effectively release the heat generated by cutting, prevent temperature rise due to cutting and suppress deterioration of the hard coated layer 3'. As a result, in high-speed cutting where the cutting edge 9 is tend to reach high temperature, the hard coated layer 3' does not deteriorate and a good tool life can be shown. The desirable range of the contact angle of water $\theta_R$ is 40 to 60° in order to optimize the way in which a cutting fluid spreads so that cutting performance of the tool 10 can be shown to the maximum.

On the other hand, as in the above-mentioned first embodiment, when the contact angle of water $\theta_R$ is larger than 80°, a cutting fluid hardly spreads throughout the rake face 7 and cannot adequately release the heat generated by cutting. Consequently, temperature rise on the rake face 7 and the cutting edge 9 of the tool 10 causes deterioration of the hard coated layer 3', leading to lowing wear resistance, film peeling, chipping and other tool damage. When the contact angle of water $\theta_R$ is smaller than 30°, a cutting fluid too easily spreads through the rake face 7 and permeates the deeper inside of the hard coated layer 3' because of cooling crack inside the hard coated layer 3' of the tool 10. Consequently, the rake face 7 reaches high temperature at the time of cutting and the cutting fluid coming into the crack of the hard layer 3' makes it easy to deteriorate the hard layer 3' and lowers wear resistance.

The contact angle of water $\theta_F$ is preferably in the range of 91 to 140°. This makes it difficult for a work material which is softened by the heat generated by cutting to adhere to the flank face 8. Namely, adhesion resistance on the flank face 8 can be improved. Therefore, even in high-speed cutting processes, adhesion to the flank face 8 is not seen and accuracy in the finished surface of the work material can be in good condition. The desirable range of the contact angle of water $\theta_F$ is 93 to 120°, more desirably 95 to 115° in order to prevent adhesion of a work material and prevent the increase of cutting resistance.

On the other hand, when the contact angle of water $\theta_F$ is smaller than 91°, a work material easily adheres, which causes damage such as layer peeling and fracture of the cutting edge 9. As a result, the adhering work material lowers accuracy in the finished surface of the work material. When the contact angle of water $\theta_F$ is larger than 140°, the cutting edge 9 has difficulty cutting into a work material and the edge of the tool 10 deteriorates, leading to increased cutting resistance. Consequently, such troubles as sudden fracture of the tool 10 and low accuracy in the finished surface due to vibration occur.

Examples of a method of measuring the contact angles of water $\theta_R$ and $\theta_F$ include measuring methods similar to the one exemplified in the first embodiment, and if possible, sessile drop method is used. First, as shown in FIG. 5, a droplet 6 composed of distilled water is put on the surface 14 [FIG. 5(a)] of the rake face which is an object to be measured or the surface 15 [FIG. 5(b)] of the flank face. Then, sessile drop method to measure the angles $\theta_R$ and $\theta_F$ made by a tangent line L of the droplet 6 in the marginal part of the area where the droplet 6 is in contact with the object to be measured and the surface 14 of the rake face which is an object to be measured or the surface 15 of the flank face is preferably used based on JIS R3257. This enables the contact angles of water $\theta_R$ and $\theta_F$ to be easily and accurately measured.

The contact angles of water $\theta_R$ and $\theta_F$ can be controlled in the same manner as the first embodiment, that is, by comprehensively optimizing energy by the surface and grain boundary of the outer layer of the hard layer 3' on the rake face 7 and the flank face 8. Surface energy and grain boundary energy which constitute interfacial energy are changed by overall characteristics such as manufacturing conditions including heat history at the time of deposition, flow rate of reactants and deposition time in addition to properties such as film material of the surface layer of the hard layer 3' on the rake face 7 and the flank face 8, particle size and surface roughness. Therefore, it is necessary to comprehensively take into account such conditions as properties and manufacturing methods.

Preferably, the surface roughness in maximum height Rz arithmetical 14 on the rake face 7 of the hard layer 3' is in the range of 0.3 to 1.5 μm. This can control characteristics variation throughout the rake face 7 and easily adjust the contact angle of water $\theta_R$ within the above range. Furthermore, preferably, the arithmetic arithmetical mean surface roughness Ra of the surface 14 on the rake face 7 of the hard layer 3' is in the range of 0.05 to 0.3 μm in the range of the maximum height roughness Rz. This can optimize surface energy and the contact angle of water $\theta_R$, easily spread a cutting fluid throughout the rake face 7 and efficiently lower the temperature raised by cutting. Measurement of surface roughness (Ra, Rz) may be conducted in the same manner as the first embodiment.

Examples of material constituting the hard layer 3' include material similar to the one exemplified for the hard layer 3 in the first embodiment. In this embodiment, the outer layer on the rake face 7 is preferably composed of a titanium nitride (TiN) layer, a zirconium nitride (ZrN) layer or an aluminum oxide ($Al_2O_3$) layer having α-type crystal structure. This can provide better heat conductivity than the one composed of a titanium carbide layer and a titanium carbonitride layer, improve heat release on the rake face 7 in addition to heat release by a cutting fluid and prevent temperature rise of a cutting edge 9 by cutting.

In particular, the outer layer on the rake face 7 is preferably composed of a titanium nitride layer. Titanium nitride is desirable because it has high surface energy, can easily increase the contact angle of water $\theta_R$ on the surface and achieves excellent wettability to water.

In addition, by eliminating the outer layer 18 on the rake face after the outer layer 18 is formed on the lower layer 17, it is possible to provide a structure where the surface layer on the flank face 8 is the outer layer 18 and the surface layer on the rake face 7 is the lower layer 17. In this case, both the outer layer 18 and the lower layer 17 are preferably composed of titanium nitride. By adjusting the deposition conditions of the outer layer 18 and the lower layer 17 and the method of eliminating the outer layer 18 after deposition, the contact angle of water of these layers can be easily controlled. In this embodiment, the surface layer stands for a layer exposed on the surface of the hard layer 3' or a layer constituting the surface of the hard layer 3'.

When the outer layer 18 is composed of a titanium nitride layer or a zirconium nitride layer, for the same reason as in the first embodiment, it is preferable that the hard layer 3' on the cutting edge 9 is polished so that the outer layer 18 can remain on the cutting edge 9.

Next, the method of manufacturing a cutting tool according to the above-mentioned second embodiment will be described.

First, the substrate 2 is prepared in the same manner as the above-mentioned first embodiment.

Then, the hard layer 3' is formed on the surface of the substrate 2, for example, through chemical vapor deposition (CVD) method. In this embodiment, as mentioned above, the contact angle of water $\theta_R$ to the surface 14 on the rake face 7 of the hard layer 3' is smaller than the contact angle of water $\theta_F$ to the surface 15 on the flank face 8 of the hard layer 3'. Namely, it is important to form the hard layer 3' so that surface energy on the rake face 7 can be larger than surface energy on the flank face 8. As a method of the hard layer 3', for example, the first and second manufacturing methods as described below can be referred to.

(First Manufacturing Method)

In the first manufacturing method, as the surface layer constituting the surface of the hard layer 3', the lower layer 17 whose contact angle of water $\theta_A$ and the outer layer 18 whose contact angle of water $\theta_B$ ($\theta_A<\theta_B$) are formed in sequence. Then, by brushing the rake face 7, the outer layer 18 is eliminated on the rake face and as shown in FIG. 4, the lower layer 17 is exposed on the rake face 7 of the hard layer 3'. Thereby, it is possible to easily manufacture the tool 10 wherein the surface layer on the flank face 8 is the outer layer 18 and the surface layer on the rake face 7 is the lower layer 17 and the contact angle of water $\theta_R$ on the rake face 7 is smaller than the contact angle of water $\theta_F$ on the flank face 8 ($\theta_R<\theta_F$).

Especially, in order to easily control surface energy in accordance with deposition conditions, it is preferable to use titanium nitride as particles constituting the outer layer 18 and the lower layer 17. For example, deposition temperature, flow rate of reactants and deposition time may be adjusted.

As a method of coating the outer layer 18 and the lower layer 17 so that the contact angles of water $\theta_A$ and $\theta_B$ can be $\theta_A<\theta_B$, for example, the deposition conditions of the outer layer 18 and the lower layer 17 is adjusted so that the mean particle size of particles constituting the outer layer 18 can be made larger than the mean particle size of particles constituting the lower layer 17.

To be more specific, desirably, the mean particle size of particles constituting the outer layer 18 is in the range of 1.0 to 3.0 μm, preferably, in the range of 1.2 to 2.0 μm and the mean particle size of particles constituting the lower layer 17 is in the range of 0.01 to 2.0 μm, preferably, in the range of 0.05 to 1.0 μm.

The above structure makes it possible to set the mean particle size of particles constituting the upper part of the surface side of the surface layer to the range of 1.0 to 3.0 μm and the mean particle size of particles constituting the lower surface of the substrate 2 side of the surface layer to the range of 0.01 to 2.0 μm. The surface layer is the outer layer 18 or the lower layer 17.

The mean particle size of particles constituting the outer layer 18 and the lower layer 17 of the hard layer 3' in the tool 10 stands for a diameter of the circle obtained by observing the structure of the surface or cross-sectional surface of the outer layer 18 and the lower layer 17 with the use of a scanning electron microscope or a transmission electron microscope, calculating the areas of each particle constituting the outer layer 18 and the lower layer 17 through image analysis method in the image observed in the field of view of not less than 100 nm×100 nm, estimating their average area and then converting the average area into a circle.

This can optimize grain boundary energy of the outer layer 18 and the lower layer 17. That is, preferably, in the hard layer 3', the lower layer 17 whose mean particle size is smaller than the mean particle size of the outer layer 18 of the hard layer 3', and the outer layer 18 are stacked in this order, and the outer layer 18 is removed on the rake face 7 of the hard coated layer 3' so as to expose the lower layer 17. Thereby, as shown in FIG. 4, in the outer layer 18 which finally constitutes the flank face 8, grain boundary energy is optimized and the contact angle of water is controlled in a more preferable range. As a result, even in high-speed cutting, adhesion of a work material can be suppressed on the flank face 8. Moreover, in the lower layer 17 which finally constitutes the rake face 7, it is possible to optimize grain boundary energy, improve wettability to a cutting fluid, sufficiently spread a cutting fluid and prevent temperature rise of the cutting edge 9 by cutting. In other words, the outer layer 18 which finally constitutes the flank face 8 has a large contact angle of water and excellent adhesion resistance, and the lower layer 17 which finally constitutes the rake face 7 can be made a film having a small contact angle of water and excellent wettability.

Next, each deposition step will be concretely described.

First, as a step of coating the outer layer 18 having a large contact angle of water, for example, pressure inside the reacting furnace may be set to as low as 1 to 30 kPa. This reduces the number of atoms in the reacting furnace, allows raw material atoms and molecules to sufficiently diffuse when they diffuse on the surface, achieves crystallization without causing defect and lowers interfacial energy. Therefore, surface energy on the outer layer 18 can be made small, and the contact angle of water of the outer layer can be controlled in the range of the contact angle of water $\theta_F$ on the flank face 8 of this embodiment.

Furthermore, by setting a concentration of reactants to mixed gas to 0.05 to 0.4% by volume, the ratio Vg/Vr to 0.4 to 0.7 and a deposition temperature to the range of 880 to 950° C., orientation direction of crystals on the surface of the outer layer 18 can be the direction in which surface energy is made small. Consequently, surface energy of the outer layer 18 can be made small and the contact angle of water of the outer layer can be controlled in the range of the contact angle of water $\theta_F$.

The surface layer of the rake face 7 (outer layer 18 or lower layer 17) is preferably composed of titanium nitride having an orientation coefficient Tc of 0.4 to 0.9 on a (200) crystal plane which is calculated from a peak intensity value detected by X-ray diffraction analysis and the following formula:

$$Tc = [i(200)/I_0(200)][1/6\Sigma(I(hkl)/I_0(hkl))]^{-1}$$

wherein I (200) stands for a measurement value of X-ray diffraction peak intensity on a (200) plane; $I_0$ (200) stands for a standard X-ray diffraction peak intensity on the (200) plane of JCPDS card number 6-642; and $\Sigma(I(hkl)/I_0$ (hkl)) stands for a sum of the values of [measurement value of X-ray diffraction peak intensity]/[standard X-ray diffraction peak intensity] on (111), (200), (220), (311), (222) and (400) planes.

This can reduce interfacial energy of the surface layer of the rake face 7 and easily optimize wettability of water in the surface layer within the range of this embodiment. The desirable range of an orientation coefficient Tc of titanium nitride is 0.5 to 0.8, more desirably 0.6 to 0.8.

More specifically, in order to form a titanium nitride (TiN) layer as the outer layer 18, for example, a mixed gas composed of 0.05 to 0.5% by volume of titanium chloride ($TiCl_4$) gas, 25 to 50% by volume of nitrogen ($N_2$) gas as reactive gas and hydrogen ($H_2$) gas as carrier gas for the rest as reactants composition is adjusted, and the inside of a reactor is set at a temperature of 800 to 950° C. and a pressure of 7 to 10 kPa.

As a step of coating the lower layer 17 having a small contact angle of water, for example, the ratio (Vg/Vr) of a reacting furnace volume Vr and a flow rate Vg of gas supplied per minute at room temperature and atmosphere pressure may be controlled within the following range. This changes particle size of particles constituting the lower layer 17, a percentage of defect and residual stress, making it possible to control film material of the lower layer 17 to keep interfacial energy high. As a result, the lower layer 17 has film material with a small contact angle of water and excellent wettability.

More specifically, in order to form a titanium nitride (TiN) layer as the lower layer 17, a mixed gas composed of 0.4 to 10% by volume of titanium chloride ($TiCl_4$) gas, 1 to 60% by volume of nitrogen ($N_2$) gas and hydrogen ($H_2$) gas for the rest as reactive gas composition is adjusted. The inside of a reactor is set at a temperature of 960 to 1100° C. and a pressure of 5 to 85 kPa, and adjustment is made so that the ratio (Vg/Vr) can be in the range of 0.4 to 0.9, especially, 0.5 to 0.9. In case of deposition under these conditions, there is high possibility that the orientation coefficient Tc of the (200) crystal plane of the TiN layer can be 0.4 to 0.9.

In order to form an aluminum oxide layer as the lower layer 17, a mixed gas composed of 3 to 20% by volume of aluminum chloride ($AlCl_3$) gas, 0.5 to 3.5% by volume of hydrogen chloride (HCl) gas, 0.01 to 5.0% by volume of carbon dioxide ($CO_2$) gas, 0 to 0.01% by volume of hydrogen sulfide ($H_2S$) gas and hydrogen ($H_2$) gas for the rest is used. Setting a temperature to 900 to 1010° C. and a pressure to 5 to 10 kPa, adjustment is made so that the ratio (Vg/Vr) can be 0.2 to 0.5.

As the lower layer 17, other hard films such as titanium carbide or titanium carbonitride can be also used. When a titanium-based hard film other than these titanium nitride layers is formed, as in deposition conditions of titanium nitride layer, adjustment is made so that the ratio (Vg/Vr) can be in the range of 0.4 to 0.7, especially, 0.5 to 0.6. At this time, a deposition temperature depends on material, but it is desirable to control the deposition temperature as above.

Thus, after coating the lower layer 17 and the outer layer 18, the outer layer 18 is polished on the rake face 7 so as to expose the lower layer 17. For example, when the outer layer 18 is formed so as to have a thickness of 2 μm, the outer layer 18 is polished only on the rake face 7 so as to eliminate the whole thickness of 2 μm. Thereby, the polished rake face 7 is composed of the lower layer 17 having a small contact angle of water, and the unpolished flank face 8 is composed of the outer layer 18 having a large contact angle of water, making it possible to easily manufacture the tool 10 having both the rake face 7 with excellent wettability and the flank face 8 with excellent adhesion resistance.

As a method of polishing, a desirable method is to polish a film so as to have an intended film thickness, through brushing with diamond abrasive grains #500 or smaller than #500. In the brushing process, desirably, a projection of brush bristle is 1 to 7 cm, especially, 1 to 5 cm. Even in a tool having irregular shape such as a tip breaker, this makes it possible to thoroughly polish the entire surface of the rake face 7 without leaving unpolished part in the corner of the irregular shape. Therefore, the rake face 7 can be provided with uniform surface roughness and wettability of water on the rake face 7 can be made uniform.

(Second Manufacturing Method)

Next, regarding the second manufacturing method, the case where the outer layer 18 is formed as a surface layer will be described. As shown in FIG. 6, the second manufacturing method is preferably to gradually lower the concentration of reactants to form the surface layer when the outer layer 18 (surface layer) is formed. This method makes it possible to form the gradient-structured surface layer where wettability of water progressively decreases toward the surface, that is, a contact angle of water progressively increases toward the surface. Then, after coating the film, the surface layer is polished only on the rake face 7 through brushing so that only the substrate side of the surface layer can remain.

As an example of coating the surface layer so that a contact angle of water can increase toward the surface, the surface layer is formed so that the mean particle size of particles constituting the surface layer can progressively increase from the substrate 2 side toward the surface. Namely, it is preferable that the mean particle size of particles constituting the surface layer of the hard layer 3' progressively increases from the substrate 2 side toward the surface. As in the first manufacturing method, this makes it possible to set a contact angle of water $\theta_R$ on the rake face 7 and a contact angle of water $\theta_F$ on the flank face 8 within the range of an appropriate value. In other words, as the mean particle size increases progressively, grain boundary energy decreases progressively. Eventually, the surface layer has poorer wettability closer to the surface. As a result, it is on the surface of a thicker surface layer that a layer having the highest adhesion resistance is formed.

When the surface layer on the rake face 7 undergoes brushing so that the surface layer can remain, the mean particle size of the surface 14 on the rake face 7 becomes smaller than the mean particle size of the surface 15 on the flank face 8. Thus, the contact angles of water $\theta_R$ and $\theta_F$ have a relation of $\theta_R<\theta_F$. Therefore, the surface layer of the hard layer 3' is composed of particles whose mean particle size progressively increases from the substrate 2 side toward the surface, and the mean particle size of the surface 14 on the rake face 7 is smaller than the mean particle size of the surface 15 on the flank face 8.

In order to form a titanium nitride (TiN) layer as the surface layer, a mixed gas composed of 5 to 30% by volume of titanium chloride ($TiCl_4$) gas, 25 to 50% by volume of nitrogen ($N_2$) gas and hydrogen ($H_2$) gas for the rest as reactive gas composition in the first stage of deposition is adjusted, and the inside of a reactor is set at a temperature of 800 to 950° C. and a pressure of 1 to 15 kPa. Then, as the time of deposition passes, the concentration of titanium chloride gas in the reactive gas composition is gradually lowered to 0.05 to 5% by volume, thereby making it possible to form the gradient-structured surface layer where wettability progressively decreases toward the surface.

Subsequently, for example, in order to finally prepare the rake face 7 as a 1 μm thick surface layer, using the above conditions, after coating a film so as to have a film thickness of 2 to 4 μm which is 2 to 4 times as large as a final film thickness, polishing is carried out so as to have the final film thickness, under the above processing conditions such as brushing with diamond abrasive grains #500 or smaller than #500.

The mean particle size of particles constituting the surface layer may be measured in the same manner as the above measuring method. As for the photograph used for image analysis, for example, measurement is conducted in at least three places where the thickness from the substrate 2 side in the surface layer becomes the same through the method to polish and expose the surface layer in parallel with the surface of the substrate 2, and their average value is a mean particle size. When it is difficult to measure mean particle size on the polished surface through image analysis, the mean particle size may be measured and compared at each place where the thickness from the substrate 2 side to the surface in the surface layer is the same on the cross-sectional surface of the surface layer.

As shown in FIGS. 4 and 6, the above embodiment describes the case where the hard layer 3' is composed of six layers, but in the present invention, the hard layer 3' may be composed of not more than five layers, not less than seven layers or a single layer. In case of a single layer, it is desirably composed of a titanium nitride (TiN) layer in order to easily control surface energy, improve heat release of the rake face 7 itself because of better heat conductivity of titanium nitride as well as heat release by a cutting fluid and prevent temperature rise of a cutting edge by cutting.

In the above embodiment, a method of coating the hard layer 3' through chemical vapor deposition (CVD) method is described. However, the present invention is not limited to this and other deposition methods including physical vapor deposition (PVD) method may be used to form the hard layer 3'.

(Method of Processing Work Material)

Next, one embodiment of a method of processing a work material according to the present invention will be described. The processing method of this embodiment is to process a work material with the use of the cutting tool 1 according to the first embodiment.

In other words, it comprises the steps of putting the cutting edge 9 of the cutting tool 1 on the surface of a work material, rotating either the cutting edge 9 or the work material and separating the cutting edge 9 from the surface of the work material. Thereby, it becomes possible to obtain a work piece having stable and good finished surfaces.

Use of the cutting tool 10 according to the second embodiment instead of the cutting tool 1 of the first embodiment can also achieve similar effect.

Examples of the present invention will be described below. It is understood, however, that the examples are for the purpose of illustration and the invention is not to be regarded as limited to any of the specific materials or condition therein.

EXAMPLES

Example I

Preparation of Cutting Tool

First, to tungsten carbide (WC) powder having a mean particle size of 1.5 μm, 6% by weight of metallic cobalt (Co) powder having a mean particle size of 1.2 μm, 0.5% by weight of titanium carbide (TiC) powder having a mean particle size of 2.0 μm and 5% by weight of TaC powder having a mean particle size of 2.0 μm were added, mixed. Next, this mixture was molded into a cutting tool shape (CNMG120412) by press molding, followed by debinding process, and then sintered in a vacuum of 0.01 Pa at 1500° C. for one hour. Thereby, cemented carbide was prepared. In addition, through brushing, the cemented carbide so prepared underwent edge treatment (honing R) from the rake face.

Next, through chemical vapor deposition (CVD) method, various hard layers composed of a multilayer of layers having the composition shown in Table 2 were formed on the above cemented carbide. The deposition conditions of each layer in Table 2 were presented in Table 1. At this time, the reacting furnace volume Vr of chemical vapor deposition equipment was 0.12 $m^3$.

After coating the hard layer, through polishing method shown in Table 2, the surface of the samples was polished to adjust a layer thickness of the surface layer to the value mentioned in Table 2, thereby preparing the cutting tools of Sample Nos. I-1 to I-10.

As for the tools so obtained, the contact angle of water θ on the surface was measured in the flat part of the rake face of the hard layer through sessile drop method based on JIS R3257 as shown in FIG. 1. The results were shown in Table 2.

The surface roughness (maximum height Rz, arithmetic arithmetical mean surface roughness Ra) of the surface in the flat part (rake face) such as land close to the cutting edge of the tool was measured with a stylus-type surface roughness measuring instrument based on JIS B0601' 01 with a cutoff value of 0.25 mm, a reference length of 0.8 mm and a scanning speed of 0.1 mm/second. The results were shown in Table 2.

Furthermore, the hard layer of the tool so obtained was observed at a magnification of 500,000 under a transmission electron microscope (TEM), and the mean particle size of the surface layer on the rake face was measured through image analysis method. The results were shown in Table 2. Specifically, the mean particle size of the surface layer was calculated as the diameter of the circle when the area of each particle was calculated and the average value was converted into a circle having the same area.

TABLE 1

| Hard layer | Mixed gas composition (% by volume) | Vg/Vr[1] | Flow rate of mixed gas (L/min) | deposition temperature (°C.) | Pressure (kPa) |
|---|---|---|---|---|---|
| TiN1 | TiCl$_4$: 0.5, N$_2$: 33, H$_2$: the rest | 0.67 | 80 | 1000 | 16 |
| TiN2 | TiCl$_4$: 0.5, N$_2$: 44, H$_2$: the rest | 0.42 | 50 | 1000 | 12 |
| TiN3 | TiCl$_4$: 0.5, N$_2$: 33, H$_2$: the rest | 0.29 | 35 | 1000 | 12 |
| ZrN | ZrCl$_4$: 0.3, N$_2$: 33, H$_2$: the rest | 0.54 | 65 | 1000 | 15 |
| TiCN | TiCl$_4$: 1.0, N$_2$: 43, CH$_3$CN: 0.3, H$_2$: the rest | 0.58 | 70 | 860 | 10 |
| TiCNO | TiCl$_4$: 0.7, CH$_4$: 4, N$_2$: 5, CO$_2$: 1.0, H$_2$: the rest | 0.29 | 35 | 1010 | 10 |
| TiCO | TiCl$_4$: 0.7, CH$_4$: 4, CO$_2$: 1.2, H$_2$: the rest | 0.29 | 35 | 1010 | 10 |
| TiNO | TiCl$_4$: 0.7, CH$_4$: 4, N$_2$: 5, CO$_2$: 1.1, H$_2$: the rest | 0.29 | 35 | 1010 | 10 |
| TiC2 | TiCl$_4$: 1.0, CH$_4$: 6, H$_2$: the rest | 0.54 | 65 | 1000 | 10 |
| Al$_2$O$_3$1 | AlCl$_3$: 15, HCl: 2, CO$_2$: 4, H$_2$S: 0.01, H$_2$: the rest | 0.42 | 50 | 1005 | 6 |
| Al$_2$O$_3$2 | AlCl$_3$: 15, HCl: 2, CO$_2$: 4, H$_2$S: 0.01, H$_2$: the rest | 0.08 | 10 | 1005 | 6 |

[1] In this example, Vr = 0.12 m$^3$

TABLE 2

| Sample No.[1] | Hard layer[2] Under layer | | | | | Surface layer[3] | Polishing Method | Abrasive grain | Projection of bristles of brush (cm) |
| | First layer | Second layer | Third layer | Fourth layer | Fifth layer | | | | |
|---|---|---|---|---|---|---|---|---|---|
| I-1 | TiN1 (0.5) | TiCN (9.0) | TiCNO (0.5) | Al$_2$O$_3$2 α-Al$_2$O$_3$ (2.0) | — | TiN1 (2.0→0.5) [0.08] | Brush | Diamond (#3000) | 5 |
| I-2 | TiN1 (0.6) | TiCN (3.0) | TiN2 (0.5) | TiCNO (0.1) | Al$_2$O$_3$2 α-Al$_2$O$_3$ (4.0) | TiN1 (1.5→0.2) [0.05] | Brush | Diamond (#3000) | 7 |
| I-3 | TiN1 (1) | TiCN (5.0) | TiNO (0.3) | Al$_2$O$_3$2 α-Al$_2$O$_3$ (2.0) | — | TiN1 (1.0→0) [0.12] | Brush | Diamond (#1000) | 3.5 |
| I-4 | TiCN (0.5) | TiCN (7.0) | TiCNO (0.1) | Al$_2$O$_3$1 α-Al$_2$O$_3$ (5.0) | — | TiN2 (2.0→1) [1.0] | Brush | Diamond (#500) | 3 |
| I-5 | TiN1 (0.6) | TiCN (7.0) | TiCNO (0.3) | — | — | Al$_2$O$_3$1 α-Al$_2$O$_3$ (5.0→2.0) [1.8] | Brush | Diamond (#1000) | 1 |
| I-6 | TiN1 (0.5) | TiCN (5.6) | TiCN (1.5) | TiCNO (0.4) | Al$_2$O$_3$2 α-Al$_2$O$_3$ (3.0) | ZrN (4.0→1.0) [1.0] | Brush | Diamond (#2000) | 2 |
| I-7 | TiCN1 (1.0) | TiCN (6.0) | — | Al$_2$O$_3$1 κ-Al$_2$O$_3$ (4.0) | — | TiC (2.5→0.5) [0.4] | Brush | Diamond (#2000) | 2.5 |
| *I-8 | TiN1 (0.6) | TiCN (3.3) | TiCNO (0.3) | — | — | Al$_2$O$_3$2 α-Al$_2$O$_3$ (5.0→4.8) [2.5] | Brush | Al2O3 (#1000) | 0.3 |
| *I-9 | TiCN1 (3.3) | TiCNO (0.5) | Al$_2$O$_3$1 (3.0) | — | — | TiN3 (2→1.5) [2.5] | Brush | Diamond (#2000) | 10 |
| *I-10 | TiN1 (0.6) | TiCN (7.0) | TiCNO (0.5) | Al$_2$O$_3$2 α, κ-Al$_2$O$_3$ (7.0) | — | TiN1 (6→0.8) [0.005] | Barrelling | SiC (#1000) | — |

| Sample No.[1] | Surface layer on the cutting edge | Contact angle θ (°) | Surface roughness on the rake face Rz (μm) | Ra (μm) |
|---|---|---|---|---|
| I-1 | TiN | 58 | 0.68 | 0.09 |
| I-2 | α-Al$_2$O$_3$ | 50 | 0.56 | 0.05 |
| I-3 | α-Al$_2$O$_3$ | 77 | 0.75 | 0.14 |
| I-4 | TiN | 67 | 1.44 | 0.27 |
| I-5 | Al$_2$O$_3$ | 73 | 1.04 | 0.30 |
| I-6 | α-Al$_2$O$_3$ | 70 | 0.82 | 0.22 |
| I-7 | κ-Al$_2$O$_3$ | 34 | 0.53 | 0.06 |

TABLE 2-continued

| | | | | |
|---|---|---|---|---|
| *I-8 | α-Al$_2$O$_3$ | 107 | 1.78 | 0.81 |
| *I-9 | TiN | 88 | 1.20 | 0.39 |
| *I-10 | TiN | 25 | 0.30 | 0.03 |

[1] Samples marked "*" are out of the scope of the present invention.
[2] ( ) stands for layer thickness and [ ] stands for particle size. Unit: μm
[3] As for figures in ( ) of the surface layer field, figures on the left stands for film thickness of the rake face right after film forming and figures on the right stands for film thickness of the rake face after polishing.

<Evaluation>

Regarding each tool so obtained, continuous cutting test and intermittent cutting test were conducted to evaluate resistance to wear and fracture. Conditions for evaluation are as follows and the results are presented in Table 3.

(Continuous Cutting Conditions)
Work material: SCM440 cylindrical material
Cutting tool shape: CNMG120408
Cutting rate: 350 m/minute
Feed rate: 0.4 mm/rev
Cut: 2 mm
Cutting time: 20 minutes
Cutting fluid: Mixed liquid of emulsion 15%+water 85%
Evaluation item: Observing a cutting edge under a microscope, wear on the flank and wear at the tip are measured.

(Intermittent Cutting Conditions)
Work material: SCM440 cylindrical material with four grooves
Cutting tool shape: CNMG120408
Cutting rate: 150 m/minute
Feed rate: 0.5 mm/rev
Cut: 2 mm
Cutting fluid: Mixed liquid of emulsion 15%+water 85%
Evaluation item: Number of impacts before fracture
  The state of a cutting edge is observed under a microscope after 1000 impacts are given.

TABLE 3

| Sample No. [1] | Wear test:Wear amount (mm) Wear on the flank face | Fracture resistance test Number of impacts before fracture (times) | Condition of cutting edge |
|---|---|---|---|
| I-1 | 0.14 | 5200 | No damage |
| I-2 | 0.15 | 4800 | No damage |
| I-3 | 0.18 | 4600 | No damage |
| I-4 | 0.20 | 4600 | No damage |
| I-5 | 0.20 | 4200 | No damage |
| I-6 | 0.19 | 3900 | No damage |
| I-7 | 0.22 | 4000 | No damage |
| *I-8 | 0.35 | 1300 | Chipping due to adhesion |
| *I-9 | 0.28 | 2500 | Partial film peeling |
| *I-10 | 0.29 | 1700 | Chipping |

[1] Samples marked "*" are out of the scope of the present invention.

As apparent from Tables 1 to 3, Sample No. I-10 whose contact angle θ was smaller than 30° had chipping, film peeling, poor resistance to wear and fracture and very short tool life, because a cutting fluid permeated the crack of the hard film, promoting the oxidation of the hard film and causing change in quality early.

Sample Nos. I-8 and I-9 whose contact angle θ was larger than 80° had chipping and film peeling due to adhesion, poor resistance to wear and fracture and very short tool life, because the heat generated by cutting was not released enough, causing deformation of the cutting edge due to heat and deterioration of the hard layer.

In contrast, Sample Nos. I-1 and I-7 whose contact angle θ was in the range of 30° to 80° had excellent resistance to wear and fracture and little damage to the cutting edge under the above cutting conditions.

Example II-1

Preparation of Cutting Tool

In the same manner as Example I, cemented carbide was prepared and the cemented carbide so prepared underwent edge treatment (honing R) from the rake face through brushing.

Next, through chemical vapor deposition (CVD) method, various hard coated layers composed of a multilayer of layers having the composition shown in Table 5 were formed on the above cemented carbide under the conditions shown in Table 4. At this time, the reacting furnace volume Vr of chemical vapor deposition equipment was 0.12 m$^3$.

After coating the hard layer, through polishing method shown in Table 5, the surface of the sample was polished to adjust layer thickness of the outer layer to the value mentioned in Table 5. After coating the hard layer, through polishing method shown in Table 5, by polishing the surface of the rake face of the sample, the outer layer was removed and the lower layer was exposed, thereby preparing the cutting tools of Sample Nos. II-1 to II-11. Sample Nos. II-9 and II-10 which had no lower layer formed were polished so that the film thickness of the outer layer on the rake face had the value shown in Table 5.

As for the tools so obtained, the contact angles of water $θ_R$ and $θ_F$ on the surface were measured in the flat part of the rake face and flank face of the hard layer through sessile drop method based on JIS R3257 as shown in FIG. 5. The results were shown in Table 5.

The surface roughness (maximum height Rz, arithmetic arithmetical mean surface roughness Ra) of the surface in the flat part (rake face) such as land close to the cutting edge of the tool was measured in the same manner as in Example I. The results were shown in Table 5.

Furthermore, the hard layer of the tool so obtained was observed at a magnification of 500,000 under a transmission electron microscope (TEM), and the mean particle size of particles constituting the rake face and the flank face was measured through image analysis method. The surface used for image analysis is as mentioned above. The results were shown in Table 5. Specifically, the mean particle size of particles constituting the rake face and the flank face was calculated as the diameter of the circle when the area of each particle was calculated and the average value was converted into a circle having the same area.

As for the samples whose lower layer was TiN, X-ray diffraction analysis was made, using Cu for the tube. The orientation coefficient Tc on the (200) plane was figured out from the peak intensity so obtained. The results were shown in Table 5.

TABLE 4

| Hard layer | Mixed gas composition (% by volume) | deposition temperature (° C.) | Pressure (kPa) | Vg/Vr[1] | Flow rate of mixed gas (L/min) |
|---|---|---|---|---|---|
| TiN1 | $TiCl_4$: 0.08, $N_2$: 28, $H_2$:the rest | 950 | 10 | 0.38 | 45 |
| TiN2 | $TiCl_4$: 0.3, $N_2$: 44, $H_2$: the rest | 900 | 8 | 0.38 | 45 |
| TiN3 | $TiCl_4$: 5.0, $N_2$: 33, $H_2$: the rest | 1000 | 35 | 0.58 | 70 |
| ZrN1 | $ZrCl_4$: 0.3, $N_2$: 33, $H_2$: the rest | 950 | 10 | 0.33 | 40 |
| TiCN | $TiCl_4$: 1.0, $N_2$: 43, $CH_3CN$: 0.3, $H_2$: the rest | 860 | 10 | 0.63 | 75 |
| TiCNO | $TiCl_4$: 0.7, $CH_4$: 4, $N_2$: 5, $CO_2$: 1.0, $H_2$: the rest | 1010 | 10 | 0.29 | 35 |
| TiNO | $TiCl_4$: 0.7, $CH_4$: 4, $N_2$: 5, $CO_2$: 1.1, $H_2$: the rest | 1010 | 10 | 0.29 | 35 |
| $Al_2O_3$1 | $AlCl_3$: 8, HCl: 2, $CO_2$: 4, $H_2S$: 0.01, $H_2$: the rest | 1005 | 6 | 0.58 | 70 |
| TiN4 | $TiCl_4$: 0.5, $N_2$: 33, $H_2$: the rest | 1000 | 16 | 0.63 | 75 |
| TiN5 | $TiCl_4$: 0.5, $N_2$: 44, $H_2$: the rest | 1000 | 12 | 0.50 | 60 |
| ZrN2 | $ZrCl_4$: 1.0, $N_2$: 33, $H_2$: the rest | 1000 | 15 | 0.54 | 65 |
| $Al_2O_3$2 | $AlCl_3$: 15, HCl: 2, $CO_2$: 4, $H_2S$: 0.01, $H_2$: the rest | 1005 | 6 | 0.42 | 50 |

[1]In this example, Vr = 0.12 m$^3$

TABLE 5

| Sample No.[1] | Hard coating layer[2] | | | | | | Polishing | |
|---|---|---|---|---|---|---|---|---|
| | Under layer | | | | Lower layer | Outer layer | Method | Abrasive grain |
| | First layer | Second layer | Third layer | Fourth layer | | | | |
| II-1 | TiN1 (0.3) | TiCN (3.5) | TiCNO (0.1) | $Al_2O_3$1 α-$Al_2O_3$ (2.0) | TiN4 (0.3) | TiN1 (0.4) | Brush | Diamond (#3000) |
| II-2 | TiN1 (0.4) | TiCN (2.5) | TiN2 (0.2) | TiCNO (0.1) | $Al_2O_3$1 α-$Al_2O_3$ (1.0) | TiN1 (1.2) | Brush | Diamond (#3000) |
| II-3 | TiN1 (0.8) | TiCN (3.0) | TiNO (0.1) | $Al_2O_3$1 α-$Al_2O_3$ (1.5) | TiN5 (0.1) | TiN1 (0.5) | Brush | Diamond (#1500) |
| II-4 | TiCN (0.7) | TiCN (2.5) | TiCNO (0.1) | $Al_2O_3$1 α-$Al_2O_3$ (2.0) | TiN5 (0.5) | TiN2 (0.5) | Brush | Diamond (#800) |
| II-5 | TiN1 (0.4) | TiCN (2.0) | TiCNO (0.2) | $Al_2O_3$1 α-$Al_2O_3$ (3.0) | TiN5 (1.0) | TiN1 (1.1) | Brush | Diamond (#3000) |
| II-6 | TiCN (1.5) | TiCN (2.5) | $Al_2O_3$1 κ-$Al_2O_3$ (2.0) | — | TiN4 (0.2) | TiN2 (0.3) | Brush | Diamond (#1500) |
| II-7 | TiCN (5.0) | TiC (2.0) | TiNO (0.1) | $Al_2O_3$1 α-$Al_2O_3$ (3.0) | TiN4 (0.5) | ZrN1 (0.5) | Brush | Diamond (#1000) |
| II-8 | TiN1 (0.5) | TiCN (5.6) | TiCNO (0.4) | $Al_2O_3$2 α-$Al_2O_3$ (3.0) | ZrN2 (1.0) [1.0] | ZrN1 (2.0) [1.0] | Brush | Diamond (#2000) |
| *II-9 | TiN1 (0.4) | TiCN (2.5) | TiCNO (0.3) | — | — | $Al_2O_3$2 α-$Al_2O_3$ (2.5→2.0) | Blasting | $Al_2O_3$ (#1000) |
| *II-10 | TiCN (3.8) | TiCNO (0.5) | $Al_2O_3$1 (1.2) | — | — | TiN3 (1.5→0.5) | Brush | Diamond (#2000) |
| *II-11 | TiN1 (0.4) | TiCN (2.5) | TiCNO (0.3) | $Al_2O_3$1 α, κ-$Al_2O_3$ (1.0) | TiN2 (5.0) | TiN4 (1.0) | Brush | Diamond (#5000) |

| Sample No.[1] | Contact angle | | | Surface roughness on the rake face | | Mean particle size (μm) | | Orientation coefficient of (200) plane of surface layer[3] |
|---|---|---|---|---|---|---|---|---|
| | $\theta_R$ (°) | $\theta_F$ (°) | $\theta_R/\theta_F$ | Rz (μm) | Ra (μm) | Lower layer | Outer layer | |
| II-1 | 79 | 98 | 0.81 | 0.63 | 0.08 | 0.89 | 1.4 | 0.78 |
| II-2 | 59 | 107 | 0.55 | 0.30 | 0.06 | 1.4 | 1.9 | 0.95 |
| II-3 | 72 | 88 | 0.82 | 0.84 | 0.28 | 0.07 | 0.89 | 0.84 |
| II-4 | 56 | 130 | 0.43 | 1.37 | 0.31 | 0.30 | 1.4 | 0.44 |
| II-5 | 55 | 102 | 0.54 | 1.20 | 0.24 | 0.5 | 1.4 | 0.71 |
| II-6 | 82 | 124 | 0.66 | 0.48 | 0.09 | 0.59 | 0.9 | 0.48 |

TABLE 5-continued

| | | | | | | | | |
|---|---|---|---|---|---|---|---|---|
| II-7 | 75 | 125 | 0.60 | 1.00 | 0.20 | 0.65 | 1.0 | 0.6 |
| II-8 | 80 | 110 | 0.73 | 1.11 | 0.23 | 0.44 | 1.2 | 0.58 |
| *II-9 | 91 | 88 | 1.03 | 1.82 | 0.91 | — | 3.7 | — |
| *II-10 | 89 | 89 | 1.00 | 1.31 | 0.34 | — | 0.6 | 1.5 |
| *II-11 | 145 | 82 | 1.77 | 0.11 | 0.05 | 3.5 | 0.88 | 0.2 |

[1])Samples marked "*" are out of the scope of the present invention.
[2])( ) stands for layer thickness. Unit: μm
The indication of (A→B) in the outer layer of Sample Nos. II-9 and II-10 shows that A is film thickness on the rake face right after film forming and B is film thickness on the rake face after processing.
[3])Orientation coefficient $T_c$ Orientation coefficient of (200) plane of TiN <Evaluation>

Regarding each tool so obtained, continuous cutting test was conducted under the following conditions to evaluate resistance to wear and fracture. The results were presented in Table 6.

(Continuous Cutting Conditions)
Work material: SCM440 cylindrical material
Cutting tool shape: CNMG120408
Cutting rate: 350 m/minute
Feed rate: 0.2 mm/rev
Cut: 1.0 mm
Cutting time: 20 minutes
Cutting fluid: Mixed liquid of emulsion 10%+water 90%
Evaluation item: Observing a cutting edge under a microscope, wear on the flank, wear at the tip and surface roughness (arithmetic arithmetical mean surface roughness Ra) on the finished surface prevent of a work material were measured.

TABLE 6

| Sample No. [1]) | Wear on the flank face (mm) | Wear at the tip (mm) | Work material Ra (μm) | Condition of frank face |
|---|---|---|---|---|
| II-1 | 0.13 | 0.11 | 0.15 | No adhesion |
| II-2 | 0.22 | 0.17 | 0.17 | No adhesion |
| II-3 | 0.20 | 0.21 | 0.23 | Small adhesion |
| II-4 | 0.18 | 0.17 | 0.24 | Small adhesion |
| II-5 | 0.12 | 0.15 | 0.16 | No adhesion |
| II-6 | 0.15 | 0.16 | 0.19 | No adhesion |
| II-7 | 0.18 | 0.15 | 0.17 | No adhesion |
| II-8 | 0.21 | 0.17 | 0.17 | No adhesion |
| *II-9 | 0.35 | 0.29 | 0.37 | Film peeling due to adhesion |
| *II-10 | 0.27 | 0.28 | 0.32 | Large chipping |
| *II-11 | 0.21 | 0.22 | 0.42 | Fracture due to adhesion |

[1]) Samples marked "*" are out of the scope of the present invention.

As apparent from Tables 4 to 6, in Sample Nos. II-9 to II-11 whose contact angles on the rake face and the flank face didn't have a relation of $\theta_R<\theta_F$, a work material adhered to the flank face and the surface roughness of the finished surface of a work material became large. On the rake face, because insufficient release of the heat generated by cutting caused deformation of cutting edge due to heat and deterioration of the hard layer, chipping and film peeling were caused by adhesion, and resistance to wear and fracture was worsened, leading to short tool life.

In contrast, Sample Nos. II-1 to II-8 whose contact angles on the rake face and the flank face had a relation of $\theta_R<\theta_F$ had excellent resistance to wear and fracture and little damage to the cutting edge under the above cutting conditions.

Example II-2

In the same manner as Example II-1, a substrate was prepared. Then, a hard layer with the film composition of Sample No. II-2 in Table 5 was formed. At that time, regarding the conditions for TiN of the surface layer in addition to the deposition conditions of TiN1 in Table 4, a 1.5 μm thick film was formed, gradually decreasing the flow rate of reactants so that the percentage of $TiCl_4$ gas in a mixed gas was 0.5 (5 to 30) % by volume in the first stage of deposition and finally reached 0.05 (0.05 to 5) % by volume.

Subsequently, through the same processing method as Sample No. II-2, the rake face was polished so as to have a thickness of 0.5 μm.

The contact angles of water on the rake and flank faces of the sample so prepared were measured in the same manner as Example II-1. As a result, $\theta_R$ was 79° and $\theta_F$ was 92°.

Moreover, cutting test was conducted under the same cutting conditions as Example II-1. As a result, there was no damage such as chipping of a cutting edge and film peeling while very excellent tool life was shown and surface roughness in the finished surface of a work material was also very good.

It is further understood by those skilled in the art that the foregoing description is a preferred embodiment of the disclosed surface coated cutting tool and that various changes and modifications may be made in the invention without departing from the spirit and scope thereof.

What is claimed is:

1. A surface coated cutting tool, comprising a substrate having a structure where a cutting edge is formed on the cross-ridge portion of a rake face and a flank face and a hard layer formed on the surface of the substrate,
    wherein a contact an angle of water $\theta_R$ on the rake face of the hard layer and a contact angle of water $\theta_F$ on the flank face of the hard layer have a relation of $\theta_R<\theta_F$, the hard layer has a surface layer composed of particles whose mean particle size continuously increases from the substrate side toward the surface.

2. The surface coated cutting tool according to claim 1, the mean particle size of particles constituting the upper part of the surface side of the surface layer is in the range of 1.0 to 3.0 μm and the mean particle size of particles constituting the lower surface of the substrate side of the surface layer is in the range of 0.01 to 2.0 μm.

3. The surface coated cutting tool according to claim 1, the mean particle size of the surface of the hard layer on the rake face is smaller than the mean particle size of the surface of the hard layer on the flank face.

4. The surface coated cutting tool according to claim 1, the hard layer has a surface layer composed of a titanium nitride layer or a zirconium nitride layer, and the hard layer on the cutting edge is polished so that the surface layer can remain on the cutting edge.

5. A surface coated cutting tool, comprising a substrate having a structure where a cutting edge is formed on the cross-ridge portion of a rake face and a flank face and a hard layer formed on the surface of the substrate, wherein a contact angle of water $\theta_R$ on the rake face of the hard layer and a contact angle of water $\theta_F$ on the flank face of the hard layer have a relation of $\theta_R<\theta F$, the hard layer has an outer layer and a lower layer whose mean particle size is smaller than the mean particle size of the outer layer, the lower layer and the outer layer are stacked in this order, and the outer layer is removed on the rake face of the hard layer so as to expose the lower layer.

6. The surface coated cutting tool according to claim 5, the mean particle size of particles constituting the outer layer is in the range of 1.0 to 3.0 μm and the mean particle size of particles constituting the lower layer is in the range of 0.01 to 2.0 μm.

7. A surface coated cutting tool, comprising a substrate having a structure where a cutting edge is formed on the cross-ridge portion of a rake face and a flank face and a hard layer formed on the surface of the substrate, wherein a contact angle of water $\theta_R$ on the rake face of the hard layer and a contact angle of water $\theta_F$ on the flank face of the hard layer have a relation of $\theta_R<\theta F$, on the rake face, the hard layer has a surface layer composed of titanium nitride having an orientation coefficient Tc of 0.4 to 0.9 on a (200) crystal plane which is calculated from a peak intensity detected by X-ray diffraction analysis and the following formula:

$$Tc=[I(200)/I_0(200)][1/6\Sigma(I(hkl)/I_0(hkl))]^{-1}$$

wherein I (200) stands for a measurement value of X-ray diffraction peak intensity on a (200) plane;

$I_0$ (200) stands for a standard X-ray diffraction peak intensity on the (200) plane of JCPDS card number 6-642; and $\Sigma(I(hkl)/I_0(hkl))$ stands for a sum of the values of [measurement value of X-ray diffraction peak intensity]/ [standard X-ray diffraction peak intensity] on (111), (200), (220), (311), (222) and (400) planes.

* * * * *